United States Patent

Yoshida et al.

[11] Patent Number: 5,101,297
[45] Date of Patent: Mar. 31, 1992

[54] METHOD FOR PRODUCING A DIFFRACTION GRATING IN OPTICAL ELEMENTS

[75] Inventors: Toshihiko Yoshida; Osamu Yamamoto, both of Nara, Japan

[73] Assignee: Sharp Kabushiki Kaisha, Osaka, Japan

[21] Appl. No.: 465,043

[22] Filed: Jan. 16, 1990

[30] Foreign Application Priority Data

Jan. 17, 1989 [JP] Japan .................................. 1-9139

[51] Int. Cl.⁵ .................................. G02B 5/18
[52] U.S. Cl. .................................. 359/566; 385/4; 385/129; 430/296; 430/321
[58] Field of Search ............... 350/96.12, 96.13, 96.14, 350/96.19; 427/43, 273; 430/4, 5, 7, 296, 321, 323

[56] References Cited

U.S. PATENT DOCUMENTS

| | | | |
|---|---|---|---|
| 3,961,102 | 6/1976 | Ballantyne et al. | 427/43 |
| 4,805,184 | 2/1989 | Fiddyment et al. | 350/96.12 X |
| 4,877,717 | 10/1989 | Suzuki et al. | 430/321 |
| 4,900,113 | 2/1990 | Hatori | 350/96.13 |
| 4,906,063 | 3/1990 | Sato et al. | 350/96.13 |
| 4,929,042 | 5/1990 | Hatori et al. | 350/96.13 |

OTHER PUBLICATIONS

Urabe et al.; "Low Loss 0.9–1.9 GHz Saw Filters with Submicron Finger Period Electrodes"; Conference: 1980 Ultrasonics Symposium (Nov. 5–7, 1988); pp. 371–376.

G. Tohmon et al, SPIE vol. 898 Miniature Optics and Lasers (1988) pp. 70–75.

*Primary Examiner*—John D. Lee
*Assistant Examiner*—John Ngo
*Attorney, Agent, or Firm*—Morrison & Foerster

[57] ABSTRACT

A method for producing a diffraction grating in optical elements with an optical waveguide is disclosed which comprises the steps of: forming a transparent conductive film on the optical waveguide; forming an electron beam resist film on said transparent conductive film; drawing a diffraction grating pattern on said resist film with an electron beam; and developing said resist film with a diffraction grating pattern drawn thereon to form a resist film of the diffraction grating pattern.

7 Claims, 3 Drawing Sheets

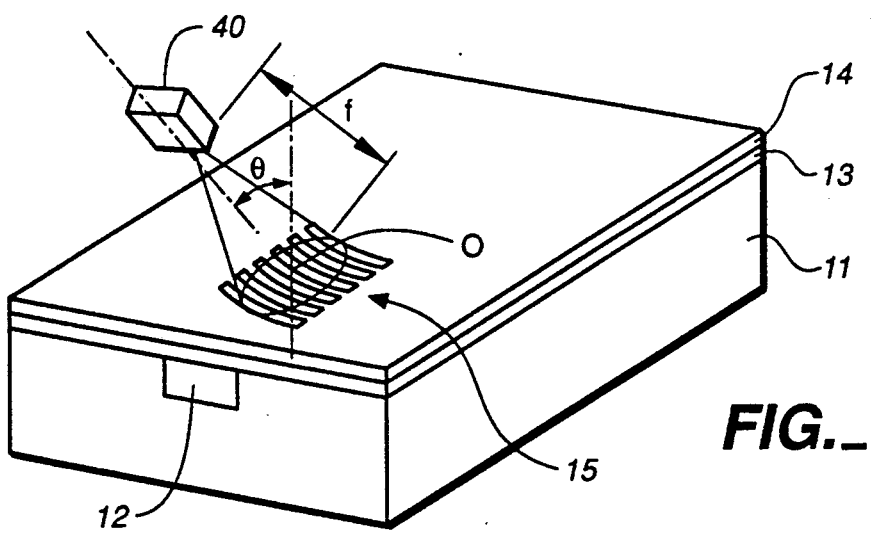
FIG._1A
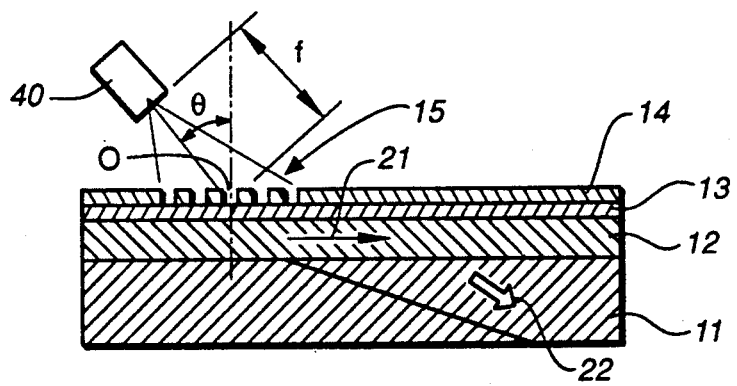
FIG._1B
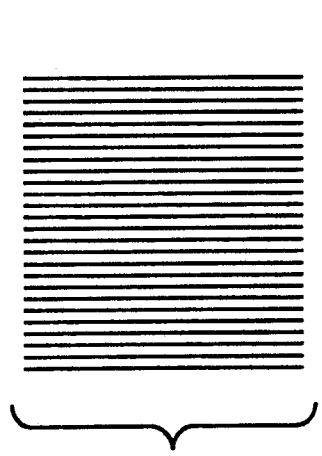
FIG._2A
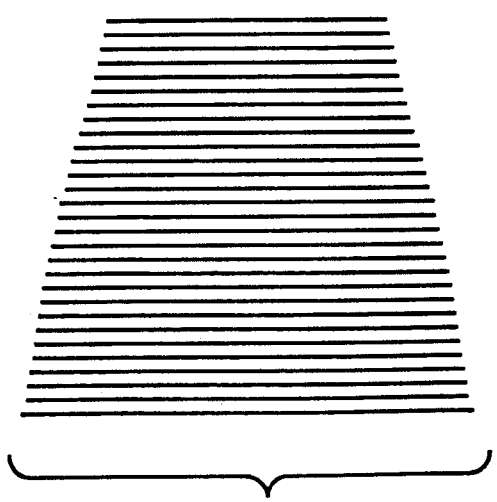
FIG._2B

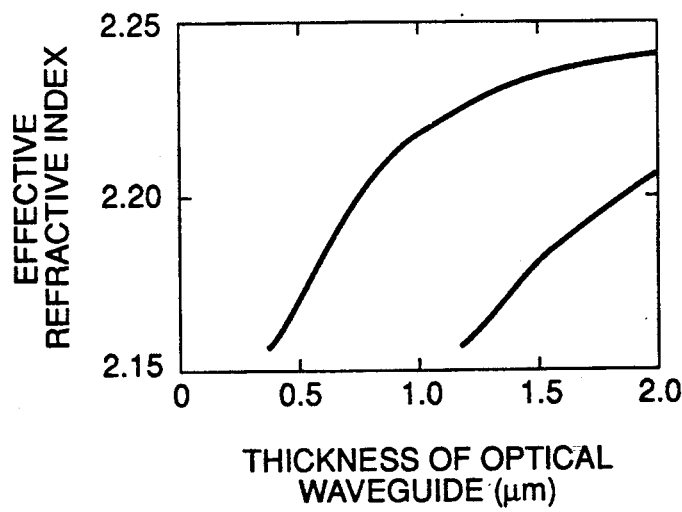
FIG._3A
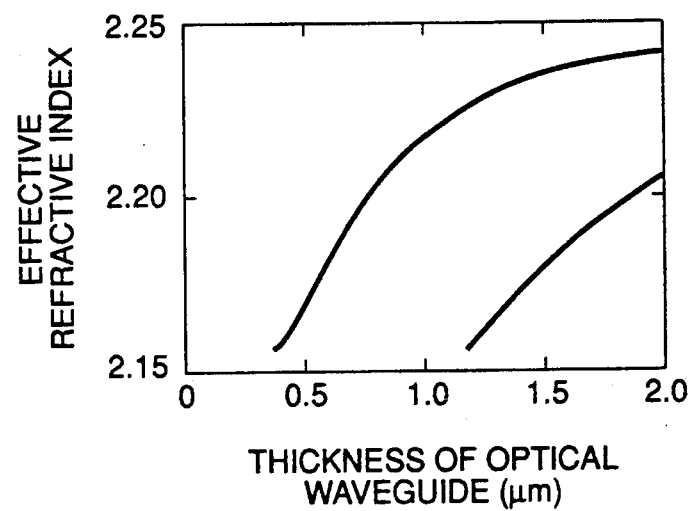
FIG._3B
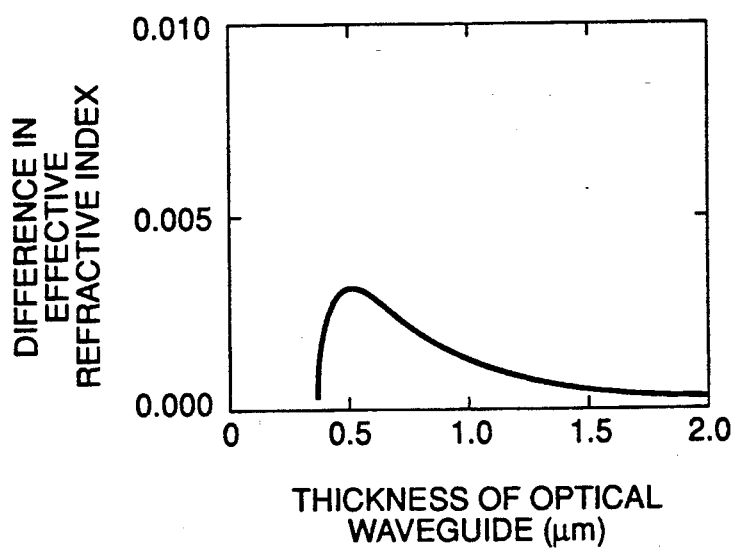
FIG._3C

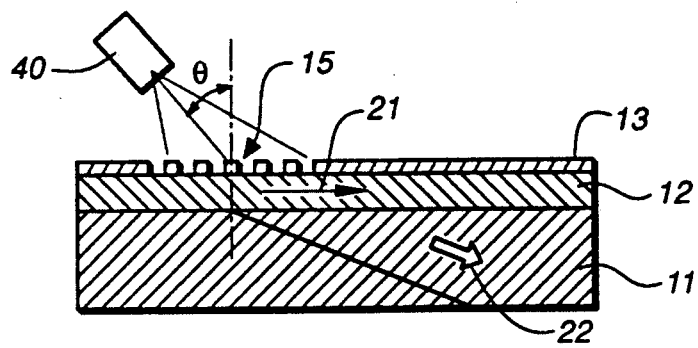
FIG._4
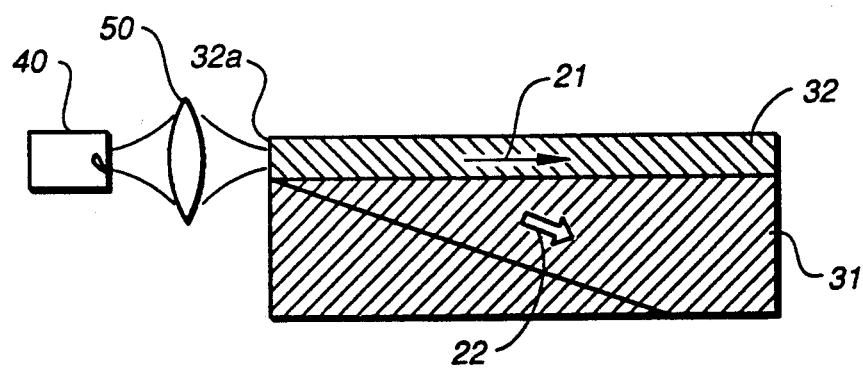
FIG._5

METHOD FOR PRODUCING A DIFFRACTION GRATING IN OPTICAL ELEMENTS

BACKGROUND OF THE INVENTION

1. Field of the Invention

This invention relates to a method for producing a diffraction grating in optical elements with a light-propagating optical waveguide. The diffraction grating is used to control waveguide light in the optical waveguide or to optically link the inside and outside of the optical waveguide.

2. Description of the Prior Art

In recent years, various optical elements for propagating light in an optical waveguide formed from a nonlinear optical material have been developed. Since an optical waveguide has very little light loss, even though its cross section is only about as large as the wavelength of the light to be propagated, there is none of the light spread which accompanies the propagation of light, so that the conversion of wavelength can be attained over the entire coherence length, the conversion efficiency can be increased, and other advantages can be realized. For example, optical waveguides are particularly useful for generating second harmonic light with a wavelength half that of the fundamental mode light by the use of second harmonic generation from nonlinear optical materials. In order to generate second harmonic light, it is important to confine the fundamental mode light in as narrow an area as possible with low loss, because the efficiency of converting from the fundamental mode light to the second harmonic light is proportional to the square of the optical density of the fundamental mode light. Therefore, a wavelength conversion element in which the optical waveguide is formed from a nonlinear optical material can confine the fundamental mode light in the optical waveguide to generate second harmonic light, thereby attaining a conversion of wavelength with high efficiency.

However, in the case of optical wavelength conversion elements, there are disadvantages that degrade the conversion efficiency of wavelength, such as difficult entry of the fundamental mode light into the optical waveguide due to its extremely small size, poor crystallinity of the nonlinear optical material caused by the formation of the optical waveguide, and, in particular, scattering of the fundamental mode light due to unevenness on the optical waveguide surface.

Previously, directing the fundamental mode light into the optical waveguide was accomplished, as shown in FIG. 5, by optically polishing the end 32a of an optical waveguide 32, which is composed of nonlinear optical crystal material and formed into a substrate 31, and condensing, by means of a lens 50 with a large numerical aperture (NA), a fundamental mode light emitted, for example, from a semiconductor laser 40. The fundamental mode light 21 propagated in the optical waveguide 32 becomes second harmonic light due, for example, to Cerenkov radiation. However, in order to direct the fundamental mode light into the optical waveguide 32, the optical axis must be adjusted precisely between the extremely small end 32a of the optical waveguide 32 and the lens 50.

For this reason, instead of using a lens 50, a diffraction grating optical coupler is used to direct the fundamental mode light into the optical waveguide 32. A diffraction grating optical coupler is a diffraction grating on the optical waveguide for directing light into the optical waveguide, and because it does not require a lens or the like, the wavelength conversion device can be made more compact and the adjustment of the optical axis between the lens and the optical waveguide is not required.

In order to obtain high coupling efficiency in a diffraction grating optical coupler, the lattice pitch of the diffraction grating must be extremely fine. Furthermore, in order to make wavelength conversion devices and similar devices using an optical element more compact, it is desirable to make the diffraction grating optical coupler a wave front conversion type accompanied by a lens or other functional elements. Therefore, it is desirable to use an electron beam exposure technique with high resolution and high-speed deflectivity.

However, when forming a diffraction grating on an optical waveguide by an electron beam exposure technique, the resist film formed on the substrate of nonlinear optical material becomes charged when irradiated with an electron beam since the nonlinear optical material is usually an insulator, thus causing the electron beam path to bend. This makes it impossible to draw a fine pattern on the optical waveguide with an electron beam. Although the deposition of a metal thin film on the optical waveguide is considered useful for preventing the resist film from being charged, a process for removing the metal thin film would be required and the agents used in removal may attack the optical waveguide.

SUMMARY OF THE INVENTION

The method for producing a diffraction grating of this invention, which overcomes the abovediscussed and numerous other disadvantages and deficiencies of the prior art, comprises the steps of: forming a transparent conductive film on the optical waveguide; forming an electron beam resist film on the transparent conductive film; drawing a diffraction grating pattern on the resist film with an electron beam; and developing the resist film with a diffraction grating pattern drawn thereon to form a resist film of the diffraction grating pattern.

In a preferred embodiment, the resist film of the diffraction grating pattern is used as a diffraction grating.

In a preferred embodiment, the abovementioned method further comprises the step of etching the transparent conductive film by the use of the resist film with a diffraction grating pattern drawn thereon as a mask, resulting in a diffraction grating composed of the etched transparent conductive film.

In a preferred embodiment, the transparent conductive film is made of indium tin oxide (ITO).

In a preferred embodiment, the electron beam resist film is made of poly(methyl methacrylate) (PMMA).

In a preferred embodiment, the diffraction grating pattern is drawn by an electron beam exposure technique.

Thus, the invention described herein makes possible the objectives of (1) providing a method for producing a diffraction grating of the prescribed shape on an optical waveguide of nonlinear optical material with great ease by an electron beam exposure technique; and (2) providing a method for producing a diffraction grating with highly accurate dimensions on an optical waveguide of nonlinear optical material with great ease by an electron beam exposure technique.

BRIEF DESCRIPTION OF THE DRAWINGS

This invention may be better understood and its numerous objects and advantages will become apparent to those skilled in the art by reference to the accompanying drawings as follows:

FIG. 1a is a perspective view showing an optical wavelength conversion element with a diffraction grating produced by a method of this invention.

FIG. 1b is a sectional view showing the optical wavelength conversion element of FIG. 1a.

FIG. 2a is a schematic diagram showing a diffraction grating pattern obtained by the method of this invention.

FIG. 2b is a schematic diagram showing a diffraction grating pattern obtained by a conventional method.

FIG. 3a is a graph showing the relationship between the layer thickness and the effective refractive index of an optical waveguide at that portion of a diffraction grating where an electron beam resist film exists.

FIG. 3b is a graph showing the relationship between the layer thickness and the effective refractive index of an optical waveguide at that portion of the diffraction grating where the electron beam resist film does not exist.

FIG. 3c is graph showing the difference in the effective refractive index between the graphs of FIGS. 3a and 3b.

FIG. 4 is a sectional view showing another optical wavelength conversion element with a diffraction grating produced by another method of this invention.

FIG. 5 is a sectional view showing a conventional optical wavelength conversion element.

DESCRIPTION OF THE PREFERRED EMBODIMENTS

The method for producing a diffraction grating of this invention, for example, is applied to the formation of a diffraction grating optical coupler on an optical wavelength conversion element using second harmonic generation.

EXAMPLE 1

FIGS. 1a and 1b, show an optical wavelength conversion element in which a striped optical waveguide 12 formed in the middle portion of a substrate 11. The substrate 11 is made of the nonlinear optical material LiNbO$_3$. After a striped mask pattern of photoresist is formed on the substrate 11 by photolithography, the optical waveguide 12 is formed by a proton exchange method with benzoic acid at 220° C. for about 30 minutes.

As shown in FIG. 1b, when the fundamental mode light 21 is propagated in the optical waveguide 12, second harmonic light 22 with a wavelength half that of the fundamental mode light 21 is generated, for example, by Cerenkov radiation. For example, when a YAG laser light with a wavelength of 1064 nm is propagated in the optical waveguide 12 as the fundamental mode light, second harmonic light with a wavelength of 532 nm is generated.

The method of this invention is preferably used to form a diffraction grating optical coupler on an optical wavelength conversion element of this kind. First, using a sintered target consisting of In$_2$O$_5$ mixed with 10% SnO$_2$, an indium tin oxide (ITO) film 13 as a transparent conductive film is deposited on the substrate 11 including the optical waveguide 12 to a thickness of about 0.1 μm by RF spattering. In this case, it is preferred that the temperature of the substrate 11 be raised as much as possible to increase the transparency of the ITO film 13. However, if the temperature of the substrate 11 is raised too high, the optical waveguide 12 may spread due to proton diffusion. Therefore, the temperature of the substrate 11 is preferably set to about 200° C. during depositing of the ITO film 13. In this example, the temperature of the substrate 11 was set to 200° C. during the depositing.

Next, polymethyl methacrylate (PMMA) film 14 is formed on the ITO film 13 as an electron beam resist film and then appropriately cured by prebaking for 20 minutes at 180° C. The diffraction grating pattern is then drawn on the PMMA film 14 with an electron beam exposure apparatus, and the diffraction grating 15 is formed by developing the PMMA film 14.

In this example, using an electron beam to form a diffraction grating pattern with a lattice pitch of about 0.5 μm and a uniform lattice width, the diffraction grating pattern shown in FIG. 2a was obtained. For comparison, when a similar diffraction grating pattern was formed by an electron beam exposure technique without providing an ITO transparent conductive film, only the diffraction grating pattern shown in FIG. 2b was obtained. In the diffraction grating pattern of this example shown in FIG. 2a, the grating width remains nearly constant, whereas in the comparative example shown in FIG. 2b, the grating width gradually increases. This indicates that the charging of resist film causes the electron beam path to curve. In the diffraction grating pattern of this example, a lattice pitch of about 0.5 μm over the entire pattern was obtained, whereas in the comparative example, the lattice pitch increased to a maximum of 0.8 μm.

In an optical wavelength conversion element with a diffraction grating optical coupler obtained in this manner, a laser light emitted from a point light source such as a semiconductor laser 40 is directed into the optical waveguide 12 by the diffraction grating optical coupler. In order to improve the coupling efficiency of the diffraction grating optical coupler, the laser light emitted from the semiconductor laser 40 is preferably made a parallel beam inside the optical waveguide 12. The diffraction grating pattern becomes an assembly of curves defined by $$\sqrt{x^2 + (y + f\sin\theta)^2 + (f\cos\theta)^2} - Ny = m\lambda$$

(where m is an integer)

wherein f is the distance from the origin O to the point of light emission from the semiconductor laser device 40 (i.e., point light source), λ is the wavelength of the light emitted from the semiconductor laser, N is the effective refractive index of the optical waveguide 12, and θ is the incident angle of the laser light entering at the origin O, assuming the origin O is in the center of the diffraction grating. Here, y represents the coordinate in the direction of propagation of light in the optical waveguide 12 and x the coordinate in the direction perpendicular to the above direction in the optical waveguide 12.

To improve the coupling efficiency of the diffraction grating optical coupler, the diffraction grating should be made longer in direction of pitch, and the change in the effective refractive index at the diffraction grating should be made as large as possible.

The length of the diffraction grating is usually set to 1 mm or less due to aberrations of the electron beam exposure apparatus. Although the lattice width of the diffraction grating pattern should be such that the intensity of the laser light emitted by the semiconductor laser 40 is $1/e^2$, the lattice width varies depending on the spread angle of the light emitted from the light source and the focal length. In cases where the oscillation wavelength of the laser light from the semiconductor laser 40 is 830 nm, the focal length is 3 mm, and the spread angle ($1/e^2$) of the laser light is 15°, the width of the diffraction grating becomes 790 μm or less.

To increase the change in the effective refractive index at the diffraction grating 15, the thickness of the PMMA film 14 may be made large. Alternatively, the thickness of the optical waveguide 12 may also be altered. Since an increase in the thickness of the PMMA film 14 increases the exposure time, it is preferable to alter the thickness of the optical waveguide 12 in order to increase the change in the effective refractive index at the diffraction grating 15. In this example, the thickness of the electron beam resist film (i.e., PMMA film 14) was set to 0.1 μm. FIG. 3a shows the relationship between the layer thickness and the effective refractive index of the optical waveguide 12 at that portion of the diffraction grating 15 where the PMMA film 14 as the electron beam resist film exists. FIG. 3b shows the relationship between the layer thickness and the effective refractive index of the optical waveguide 12 at that portion of the diffraction grating 15 where the PMMA film 14 as the electron beam resist film does not exist. FIG. 3c shows the difference in the effective refractive index between the two graphs of FIGS. 3a and 3b. As can be seen from FIG. 3c, in order to maximize the change in the effective refractive index at the diffraction grating 15, the thickness of the optical waveguide 12 is preferably as close as possible to the thickness at the cut-off point so that the effective refractive index with respect to the fundamental mode light of the optical waveguide 12 at that portion of the diffraction grating 15 where the PMMA film 14 exists becomes lower than the refractive index of the substrate 11. Such a single-mode optical waveguide allows mode loss to decrease and the efficiency of wavelength conversion to increase. In this example, the thickness of the optical waveguide 12 was set to 0.5 μm.

EXAMPLE 2

FIG. 4 shows another optical wavelength conversion element obtained by the method of this invention. In this example, a PMMA film (not shown) as an electron beam resist film is formed into a diffraction grating pattern in the same manner as in Example 1, and using this PMMA film of the diffraction grating pattern as a mask, the ITO film 13 is etched to form the diffraction grating 15.

The method for producing a diffraction grating of this example will hereinafter be explained in detail. First, in the same manner as in Example 1, a striped mask pattern of photoresist is formed on the plane of a LiNbO$_3$ substrate 11 by photolithography. Then, an optical waveguide 12 is formed in the LiNbO$_3$ substrate 11 by proton exchange with benzoic acid. After the photoresist mask is removed, an ITO film 13 as a transparent conductive film is formed by RF spattering. Next, a PMMA film (not shown) is formed on the ITO film 13 as an electron beam resist film. On the PMMA film, a diffraction grating pattern was drawn with an electron beam and then developed to form a mask pattern. Next, using the PMMA film as an electron beam resist mask, the ITO film 13 was etched by an ion beam etching technique using Ar ions, after which the PMMA film was removed by an appropriate organic solvent such as acetone, resulting in an optical wavelength conversion element shown in FIG. 4.

In this example, the efficiency of wavelength conversion can be improved by forming the diffraction grating as a linear diffraction grating and condensing the light through the grating lens to increase the optical density of the fundamental mode light.

Although in the above examples, an ITO film was used as a transparent conductive film, an SnO$_2$ film can also be used. The SnO$_2$ film when used can be formed by a conventional spattering technique as in the above examples. While an SnO$_2$ film can reduce light propagation loss in the diffraction grating, it has high electrical resistance and poor workability. Therefore, an SnO$_2$ film is preferably used only when light propagation loss should be particularly reduced.

Moreover, the above examples explained the formation of a diffraction grating optical coupler in optical wavelength conversion elements, but the method of this invention can also be applied to the production of diffraction grating optical couplers, diffraction grating lenses, diffraction grating prisms, Bragg reflectors and other diffraction gratings for use in various optical elements such optical phase modulation elements and optical intensity modulation elements.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a diffraction grating in optical elements with an optical waveguide, comprising the steps of:
   providing an optical waveguide in a substrate made of a nonlinear optical material;
   forming a transparent conductive film on the optical waveguide;
   forming an electron beam resist film on said transparent conductive film;
   drawing a diffraction grating pattern on said resist film with an electron beam; and
   developing said resist film with a diffraction grating pattern drawn thereon to form a resist film of the diffraction pattern.

2. A method according to claim 1, wherein said resist film of the diffraction grating pattern is used as a diffraction grating.

3. A method according to claim 1, further comprising the step of etching said transparent conductive film by the use of said resist film with a diffraction grating pattern drawn thereon as a mask, resulting in a diffraction grating composed of the etched transparent conductive film.

4. A method according to claim 1, wherein said transparent conductive film is made of indium tin oxide (ITO).

5. A method according to claim 1, wherein said electron beam resist film is made of poly (methyl methacrylate) (PMMA).

6. A method according to claim 1, wherein said diffraction grating pattern is drawn by an electron beam exposure technique.

7. A method according to claim 1, wherein said nonlinear optical material comprises $LiNbO_3$.

* * * * *